(12) United States Patent
Lim

(10) Patent No.: US 6,358,779 B1
(45) Date of Patent: Mar. 19, 2002

(54) TECHNIQUE FOR REDUCING DAMBAR BURRS

(75) Inventor: Kian Siong Lim, Singapore (SG)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/614,854

(22) Filed: Jul. 12, 2000

(51) Int. Cl.⁷ .............................................. H01L 21/44
(52) U.S. Cl. ..................... 438/123; 438/106; 438/121
(58) Field of Search ............................... 438/123, 121, 438/106; 134/43

(56) References Cited

U.S. PATENT DOCUMENTS 5,753,532 A * 5/1998 Sim

* cited by examiner

Primary Examiner—Kevin M. Picardat
Assistant Examiner—D. M. Collins
(74) Attorney, Agent, or Firm—Steve Mendelsohn

(57) ABSTRACT

A technique for reducing burrs formed by a die set having a cutting insert with a screw clearance, fastened to a holding plate by a mounting screw. In one embodiment, a clamping plate is fabricated with a shape defined by two intersecting circular arcs having different diameters, a smaller arc matched to the screw clearance in the cutting insert, and a larger arc matched to an arc defined in the pocket of the holding plate. The holding plate also has a threaded hole centered in the holding plate arc. The clamping plate is fastened to the holding plate with the smaller arc abutting the screw clearance in the cutting insert, and the larger arc abutting the holding plate arc. The clamping plate reduces lateral motion of the cutting insert within the mounting plate, when the mounting screw is tightened. As a result, the gap between the cutting insert and a punch can be more accurately controlled, reducing the probability of generating burrs when dambars are removed from a semiconductor device, such as a surface-mount semiconductor device.

15 Claims, 3 Drawing Sheets

TECHNIQUE FOR REDUCING DAMBAR BURRS

BACKGROUND OF THE INVENTION

1. Field of the Invention

The present invention relates to semiconductor manufacturing, and, in particular, to a technique for reducing dambar burrs on semiconductor devices.

2. Description of the Related Art

Leads for surface-mount semiconductor devices are fabricated in a frame with a portion—known as a dambar—that must be subsequently removed. FIG. 1 shows a cutting die for dedam/dejunk die set, which is typically used to remove the dambar. As shown in FIG. 1, a dedam/dejunk die set generally comprises a cutting insert 102, mounted, with a mounting screw 104, within a pocket 106 of a holding plate 108, and a punch (not shown). The cutting insert has a cutting edge 110 and a screw clearance 112 in its edge opposite the cutting edge. Holding plate 108 has a screw clearance 114 surrounding a threaded hole 116.

After placing cutting insert 102 within pocket 106 of holding plate 108, mounting screw 104 is inserted through screw clearances 112 and 114 and fastened into threaded hole 116 in mounting plate 108 to secure the cutting insert in place. In particular, the head of mounting screw 104 presses against the bottom of screw clearance 112 in cutting insert 102, restraining movement of cutting insert 102. To sever the dambar from each lead, the dambars are pinched between cutting edge 110 of cutting insert 102 and the punch.

The clearance between the cutting edge of the cutting insert and the punch is preferably between about 5% and 9% of the lead frame thickness (e.g., about 0.008 mm in one embodiment). When the clearance between the cutting insert and the punch is too great, a small portion of the lead frame may wrap around the cutting insert before the lead frame is severed, causing a dambar burr. Dambar burrs can cause alignment and soldering reliability problems when the surface-mount semiconductor device is installed. Removing dambar burrs requires additional processing and inspection time, increasing cost and reducing process throughput.

Referring again to FIG. 1, over a period of use, pocket 106 in holding plate 108 can become worn, causing an increased clearance between cutting insert 102 and holding plate 108. In that case, the clockwise tightening action of mounting screw 104 restraining cutting insert 102 relative to holding plate 108 can cause the cutting insert to shift laterally to the right, as shown in the top view of FIG. 2. This shift of the cutting insert can cause an increase in the clearance between the cutting insert and the punch, increasing the likelihood of dambar burrs.

SUMMARY OF THE INVENTION

The present invention provides a technique for reducing dambar burrs formed by a die set having a cutting insert fastened by a mounting screw into the pocket of a holding plate. According to the present invention, the pocket and the cutting insert are configured to receive a clamping plate that inhibits the cutting insert from moving when the cutting insert is secured within the pocket of the holding plate by a mounting screw. In one implementation, the shape of the clamping plate is defined by two intersecting circular arcs of different diameter, where the smaller arc matches the screw clearance in the cutting insert, and the larger arc matches the pocket of the holding plate. The clamping plate is fastened to the holding plate with the smaller arc abutting the screw clearance in the cutting insert and the larger arc abutting the holding plate pocket. In this way, the clamping plate inhibits movement of the cutting insert, when the mounting screw is tightened.

In one embodiment, the present invention is an apparatus for mounting a cutting insert of a die set, wherein the cutting insert has a screw clearance, comprising (a) a holding plate defining a pocket configured to receive the cutting insert; and (b) a clamping plate configured to fit within the pocket of the holding plate and within the screw clearance of the cutting insert, after the cutting insert is inserted into the pocket of the holding plate, to inhibit lateral motion of the cutting insert within the pocket of the holding plate when a mounting screw is inserted through a through hole in the clamping plate and tightened into a corresponding threaded hole in the holding plate.

In another embodiment, the present invention is a method for cutting dambars from semiconductor devices, comprising the steps of (a) placing a semiconductor device having one or more dambars into a die set; and (b) cutting the one or more dambars with a cutting edge of a cutting insert of the die set, wherein the cutting insert is secured within a pocket of a holding plate of the die set using a mounting screw and a clamping plate that inhibits lateral motion of the cutting insert within the pocket when the mounting screw is tightened within a threaded hole in the holding plate.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 2:
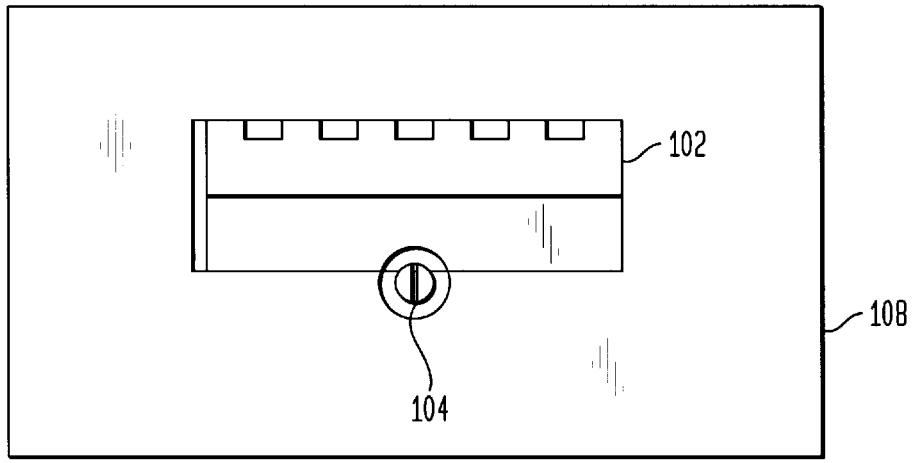
FIG. 2 is a top view of the cutting insert, holding plate, and mounting screw of the die set of FIG. 1 showing the shift of the cutting insert.
Figure 3:
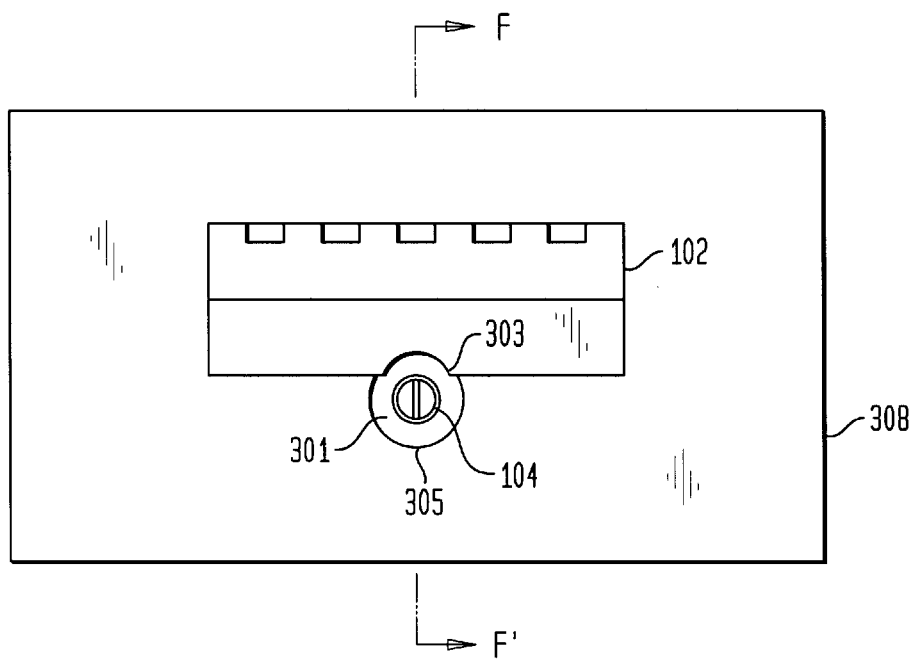
FIGS. 3 and 4 show top and sectional views of a cutting insert assembled into a holding plate of a dedam/dejunk die set with a clamping plate, according to one embodiment of the present invention.
Figure 4:
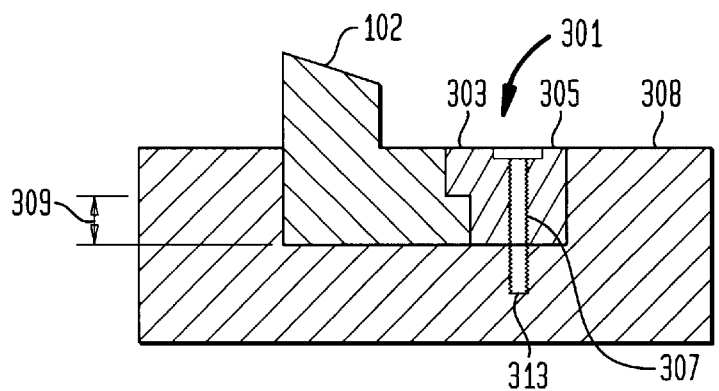
Figure 5:
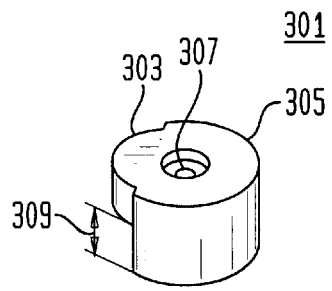
FIG. 5 shows an isometric view of the clamping plate for the dedam/dejunk die set of FIGS. 3–4.
Figure 6:
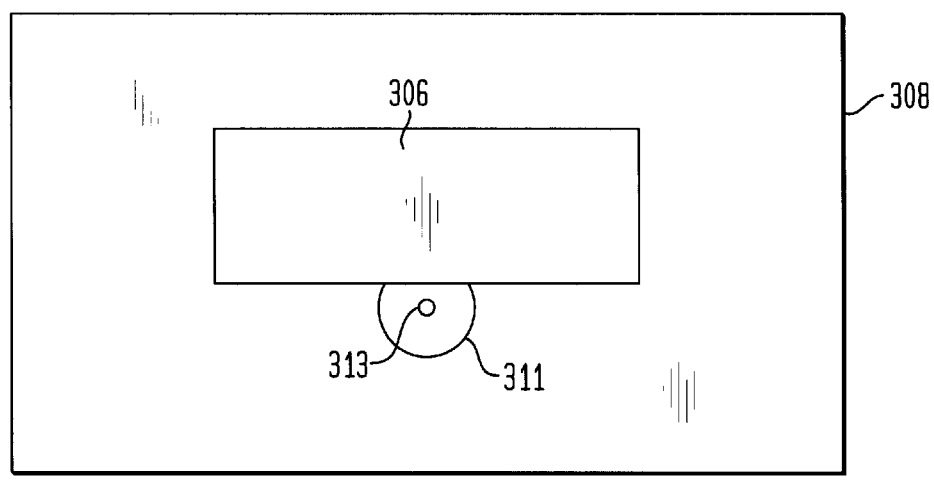
FIG. 6 shows the holding plate for the dedam/dejunk die set of FIGS. 3–4.

FIGS. 3 and 4 show top and sectional views of a cutting insert secured, with a clamping plate, within the pocket of a holding plate of a dedam/dejunk die set, according to an exemplary embodiment of the present invention. FIG. 4 is a sectional view taken generally along axis F–F' in FIG. 3. FIG. 5 shows an isometric view of clamping plate 301 of FIGS. 3–4, while FIG. 6 shows a top view of holding plate 308 of FIGS. 3–4. According to a preferred embodiment, the cutting insert is identical to cutting insert 102 of FIGS. 1–2, and holding plate 308 is manufactured from holding plate 108 of FIGS. 1–2 by modifying the shape of the pocket in order to receive clamping plate 301 in addition to cutting insert 102 and mounting screw 104.

As shown in FIG. 5, clamping plate 301 has a profile comprising two intersecting circular arcs 303 and 305 having different diameters. In one embodiment, the smaller arc 303 subtends between about 175 degrees and 185 degrees, and has a radius of between about 3.95 millimeters and 4.00 millimeters, corresponding to the standard profile of screw clearance 112 in cutting insert 102 to accommodate mounting screw 104. The larger arc 305 subtends between about 290 degrees and 310 degrees, and has a diameter of between about 10.45 millimeters and 10.50 millimeters.

At the center of the larger arc is a through hole 307, which provides a clearance hole for mounting screw 104 and is preferably countersunk to accommodate the head of mounting screw 104. As shown in FIGS. 4 and 5, clamping plate 301 has a step 309 from the bottom of the larger arc 305 to the bottom of the smaller arc 303. The thickness of clamping plate 301 (at larger arc 305) is preferably between about 7.8 millimeters and 8.2 millimeters. Step 309 preferably has a height of between about 3.00 millimeters and 3.05 millimeters.

Figure 1:
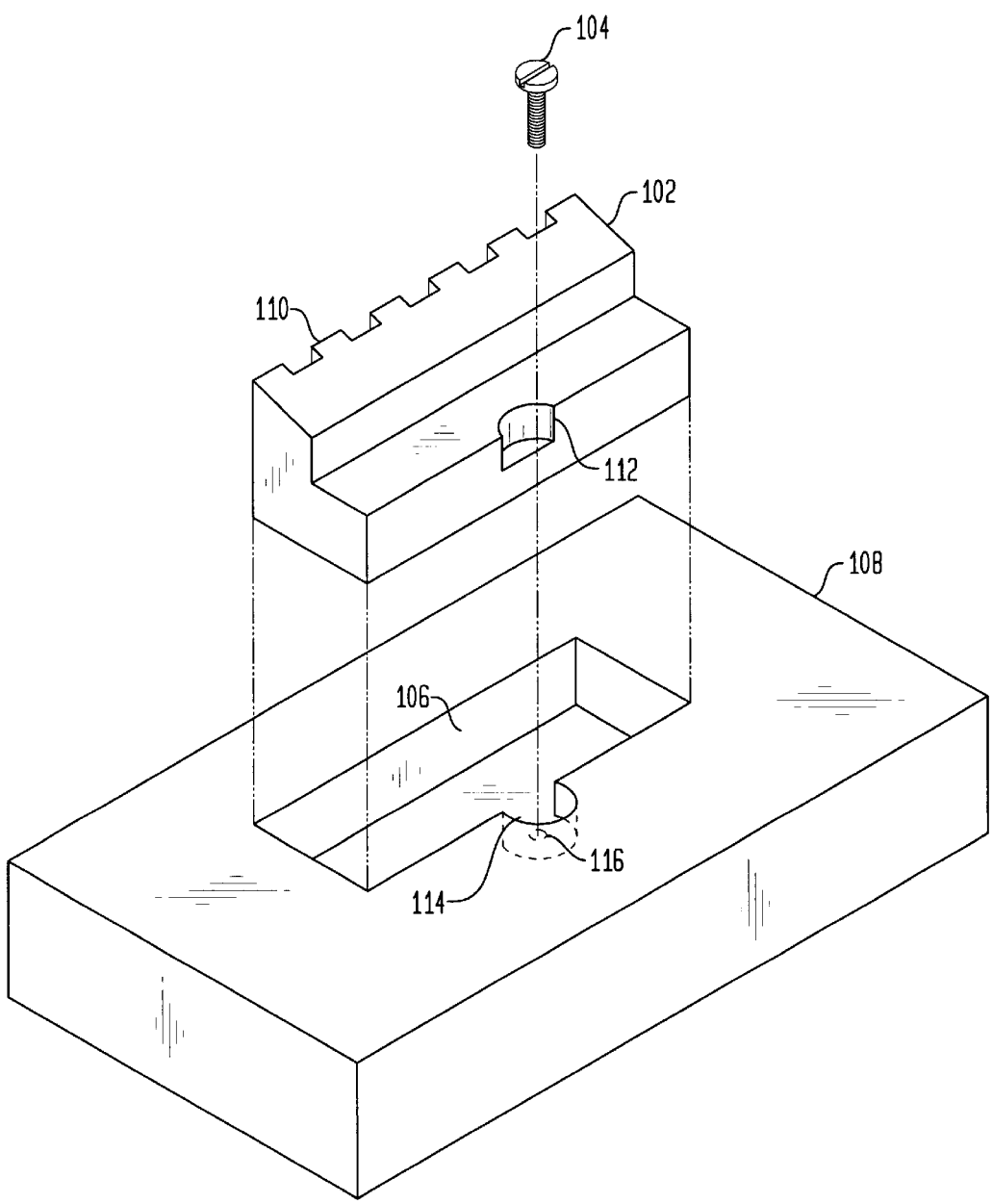
FIG. 1 is an exploded, isometric view of a cutting insert, a holding plate, and a mounting screw of a dedam/dejunk die set according to the prior art.

Referring to FIG. 6, holding plate 108 of FIGS. 1–2 may be modified to form holding plate 308 by opening up the screw clearance for the mounting screw to form an arc 311, preferably having a diameter of between about 10.50 millimeters and 10.55 millimeters to correspond to the larger arc 305 of clamping plate 301. Pocket 306 in holding plate 308 has a sufficient depth that clamping plate 301 fits flush within holding plate 308, as shown in FIG. 4. A threaded hole 313 is centered in arc 311 of holding plate 308 to receive mounting screw 104.

As indicated in FIGS. 3–4, after cutting insert 102 is inserted into pocket 306 of holding plate 308, clamping plate 301 is placed into the opening formed by arc 311 of holding plate 308 and screw clearance 112 of cutting insert 102. In particular, the smaller arc 303 of clamping plate 301 abuts the side walls of screw clearance 112 in cutting insert 102, while the larger arc 305 of clamping plate 301 abuts arc 311 in holding plate 308. As shown in FIG. 4, clamping plate 301 overlaps, but preferably does not contact, the bottom of the screw clearance 112. The clearance between the bottom of clamping plate 301 and the bottom of the screw clearance of cutting insert 102 is preferably less than about 100 microns, and most preferably between about 40 microns and 60 microns.

Mounting screw 104 is inserted into through hole 307 in clamping plate 301 and threaded into threaded hole 313 in holding plate 308. With clamping plate 301 simultaneously abutting cutting insert 102 and holding plate 308, the shape of clamping plate 301 inhibits—and preferably prevents—lateral movement of cutting insert 102 when mounting screw 104 is tightened within threaded hole 313. As a result, the clearance between cutting insert 102 and the punch (not shown) can be maintained at a desired width (e.g., between about 5% and 9% of the lead thickness).

Preferably, the clearance between the smaller arc 303 of clamping plate 301 and the sidewalls of screw clearance 112 in cutting insert 102 is less than about 0.1 millimeters. This tight fit will prevent significant lateral movement of cutting insert 102. The smaller arc 303 of clamping plate 301 also prevents rotation of clamping plate 301 around mounting screw 104. The clearance between the bottom of smaller arc 303 of clamping plate 301 and the bottom of the screw clearance in cutting insert 102, shown in FIG. 4, prevents twisting of cutting insert 102 when mounting screw 104 is tightened.

It will be further understood that various changes in the details, materials, and arrangements of the parts which have been described and illustrated in order to explain the nature of this invention may be made by those skilled in the art without departing from the scope of the invention as expressed in the following claims. For example, while the foregoing description specifically applies to a dedam/dejunk die set, embodiments of the present invention can be used to prevent lateral movement and excess clearance in any punch and die set with an insert mounted by a screw or screws. Also, the profile of the clamping plate could be a suitable shape other than a pair of intersecting circular arcs having different diameters, as long as the corresponding openings in the cutting insert and the holding plate were similarly shaped to abut the clamping plate and inhibit lateral motion of the cutting insert within the pocket of the holding plate.

What is claimed is:

1. An apparatus for mounting a cutting insert of a die set, wherein the cutting insert has a screw clearance, comprising:
   (a) a holding plate defining a pocket configured to receive the cutting insert; and
   (b) a clamping plate configured to fit within the pocket of the holding plate and within the screw clearance of the cutting insert, after the cutting insert is inserted into the pocket of the holding plate, to inhibit lateral motion of the cutting insert within the pocket of the holding plate when a mounting screw is inserted through a through hole in the clamping plate and tightened into a corresponding threaded hole in the holding plate.

2. The invention of claim 1, wherein:
   the pocket in the holding plate has a first region configured to receive the cutting insert and a second region having the threaded hole; and
   the clamping plate has a first portion configured to fit within the screw clearance of the cutting insert and a second portion configured to fit within the second region of the holding plate, wherein the second portion of the clamping plate has the through hole, such that:
   the cutting insert is securable within the holding plate by inserting the cutting insert into the first region of the pocket of the holding plate, inserting the clamping plate wherein the first portion of the clamping plate fits into the screw clearance of the cutting insert and the second portion of the clamping plate fits into the second region of the pocket of the holding plate, inserting the mounting screw through the through hole in the clamping plate, and screwing the mounting screw into the threaded hole in the holding plate, whereby the clamping plate inhibits the lateral motion of the cutting insert within the pocket of the holding plate.

3. The invention of claim 2, wherein:
   the clamping plate has a shape defined by two intersecting circular arcs, wherein:
      a smaller arc corresponds to the screw clearance in the cutting insert; and
      a larger arc corresponds to an arc in the pocket of the holding plate;
   the clamping plate defines a step from the bottom of the smaller arc to the bottom of the larger arc, such that the smaller arc is thinner than the larger arc whereby the smaller arc sits within the screw clearance of the cutting insert with the larger arc extending lower into the pocket of the holding plate;
   the clamping plate and the cutting insert define a gap between the bottom of the smaller arc and the screw clearance in the cutting insert when the cutting insert is secured within the pocket of the holding plate by the clamping plate and the mounting screw; and
   the holding plate is manufactured from an existing holding plate having an opening designed to secure the cutting insert with only the mounting screw.

4. The invention of claim 1, wherein the clamping plate has a shape defined by two intersecting circular arcs, wherein:
  a smaller arc corresponds to the screw clearance in the cutting insert; and
  a larger arc corresponds to an arc in the pocket of the holding plate.

5. The invention of claim 4, wherein the clamping plate defines a step from the bottom of the smaller arc to the bottom of the larger arc, such that the smaller arc is thinner than the larger arc whereby the smaller arc sits within the screw clearance of the cutting insert with the larger arc extending lower into the pocket of the holding plate.

6. The invention of claim 5, wherein the clamping plate and the cutting insert define a gap between the bottom of the smaller arc and the screw clearance in the cutting insert when the cutting insert is secured within the pocket of the holding plate by the clamping plate and the mounting screw.

7. The invention of claim 1, wherein the holding plate is manufactured from an existing holding plate having an opening designed to secure the cutting insert with only the mounting screw.

8. A method for cutting dambars from semiconductor devices, comprising the steps of:
  (a) placing a semiconductor device having one or more dambars into a die set; and
  (b) cutting the one or more dambars with a cutting edge of a cutting insert of the die set, wherein:
    the cutting insert is secured within a pocket of a holding plate of the die set using a mounting screw and a clamping plate that inhibits lateral motion of the cutting insert within the pocket when the mounting screw is tightened within a threaded hole in the holding plate.

9. The invention of claim 8, wherein step (a) further comprises the steps of:
  (1) inserting the cutting insert into the pocket of the holding plate;
  (2) inserting the clamping plate into a screw clearance on the cutting insert and into the pocket of the holding plate; and
  (3) inserting the mounting screw through a through hole in the clamping plate and screwing the mounting screw into the threaded hole in the holding plate.

10. The invention of claim 8, wherein step (a) further comprises the step of forming the holding plate by machining an existing holding plate having an opening designed to secure the cutting insert with only the mounting screw.

11. The invention of claim 8, wherein:
  the pocket in the holding plate has a first region configured to receive the cutting insert and a second region having the threaded hole; and
  the clamping plate has a first portion configured to fit within the screw clearance of the cutting insert and a second portion configured to fit within the second region of the holding plate, wherein the second portion of the clamping plate has the through hole, such that:
    the cutting insert is securable within the holding plate by inserting the cutting insert into the first region of the pocket of the holding plate, inserting the clamping plate wherein the first portion of the clamping plate fits into the screw clearance of the cutting insert and the second portion of the clamping plate fits into the second region of the pocket of the holding plate, inserting the mounting screw through the through hole in the clamping plate, and screwing the mounting screw into the threaded hole in the holding plate, whereby the clamping plate inhibits the lateral motion of the cutting insert within the pocket of the holding plate.

12. The invention of claim 11, wherein:
  step (a) further comprises the steps of:
    (1) forming the holding plate by machining an existing holding plate having an opening designed to secure the cutting insert with only the mounting screw;
    (2) inserting the cutting insert into the pocket of the holding plate;
    (3) inserting the clamping plate into a screw clearance on the cutting insert and into the pocket of the holding plate; and
    (4) inserting the mounting screw through a through hole in the clamping plate and screwing the mounting screw into the threaded hole in the holding plate;
  the clamping plate has a shape defined by two intersecting circular arcs, wherein:
    a smaller arc corresponds to the screw clearance in the cutting insert; and
    a larger arc corresponds to an arc in the pocket of the holding plate;
  the clamping plate defines a step from the bottom of the smaller arc to the bottom of the larger arc, such that the smaller arc is thinner than the larger arc whereby the smaller arc sits within the screw clearance of the cutting insert with the larger arc extending lower into the pocket of the holding plate; and
  the clamping plate and the cutting insert define a gap between the bottom of the smaller arc and the screw clearance in the cutting insert when the cutting insert is secured within the pocket of the holding plate by the clamping plate and the mounting screw.

13. The invention of claim 8, wherein the clamping plate has a shape defined by two intersecting circular arcs, wherein:
  a smaller arc corresponds to the screw clearance in the cutting insert; and
  a larger arc corresponds to an arc in the pocket of the holding plate.

14. The invention of claim 13, wherein the clamping plate defines a step from the bottom of the smaller arc to the bottom of the larger arc, such that the smaller arc is thinner than the larger arc whereby the smaller arc sits within the screw clearance of the cutting insert with the larger arc extending lower into the pocket of the holding plate.

15. The invention of claim 14, wherein the clamping plate and the cutting insert define a gap between the bottom of the smaller arc and the screw clearance in the cutting insert when the cutting insert is secured within the pocket of the holding plate by the clamping plate and the mounting screw.

* * * * *